US012640534B2

(12) United States Patent
Okuno

(10) Patent No.: US 12,640,534 B2
(45) Date of Patent: May 26, 2026

(54) METHOD FOR MANUFACTURING LIGHT EMITTING DEVICE, BONDING METHOD, AND LIGHT EMITTING DEVICE

(71) Applicant: NICHIA CORPORATION, Anan (JP)

(72) Inventor: Ryota Okuno, Tokushima (JP)

(73) Assignee: NICHIA CORPORATION, Anan (JP)

( * ) Notice: Subject to any disclaimer, the term of this patent is extended or adjusted under 35 U.S.C. 154(b) by 1066 days.

(21) Appl. No.: 17/730,060

(22) Filed: Apr. 26, 2022

(65) Prior Publication Data

US 2022/0344894 A1 Oct. 27, 2022

(30) Foreign Application Priority Data

Apr. 27, 2021 (JP) ................................. 2021-075148

(51) Int. Cl.
| | |
|---|---|
| *H01S 5/02* | (2006.01) |
| *H01S 5/022* | (2021.01) |
| *H01S 5/0235* | (2021.01) |
| *H01S 5/0237* | (2021.01) |

(52) U.S. Cl.
CPC ............ *H01S 5/0216* (2013.01); *H01S 5/022* (2013.01); *H01S 5/0235* (2021.01); *H01S 5/0237* (2021.01)

(58) Field of Classification Search
CPC ...... H01S 5/0216; H01S 5/022; H01S 5/0235; H01S 5/0237
See application file for complete search history.

(56) References Cited

U.S. PATENT DOCUMENTS

| | | |
|---|---|---|
| 4,836,434 A | 6/1989 | Takenaka et al. |
| 2011/0235355 A1 | 9/2011 | Seko |
| 2019/0189861 A1 | 6/2019 | Ichinokura |
| 2019/0386192 A1 | 12/2019 | Kozuru et al. |

FOREIGN PATENT DOCUMENTS

| | | | | |
|---|---|---|---|---|
| EP | 3706262 A3 | * 11/2020 | ......... | H01S 5/02375 |
| JP | S55-048936 A | 4/1980 | | |
| JP | S57-118650 A | 7/1982 | | |
| JP | S61-276237 A | 12/1986 | | |
| JP | 2009-158563 A | 7/2009 | | |
| JP | 2010-232444 A | 10/2010 | | |
| JP | 2011-204376 A | 10/2011 | | |
| JP | 2019-220672 A | 12/2019 | | |

* cited by examiner

*Primary Examiner* — Yuanda Zhang
(74) *Attorney, Agent, or Firm* — Spencer Fane LLP

(57) ABSTRACT

A method for manufacturing a light emitting device includes: disposing a light emitting element on a base member; providing a bonding agent to the base member or a lid member; and bonding the base member on which the light emitting element is disposed and the lid member with the bonding agent by sandwiching the bonding agent in a molten state between the base member and the lid member, and pressing the lid member against the base member, increasing a distance between the base member and the lid member in a state in which the lid member is pressed against the base member, while maintaining a state in which the bonding agent contacts the base member and the lid member, and solidifying the bonding agent in a state in which the distance between the base member and the lid member is increased to bond the base member and the lid member.

11 Claims, 9 Drawing Sheets

METHOD FOR MANUFACTURING LIGHT EMITTING DEVICE, BONDING METHOD, AND LIGHT EMITTING DEVICE

CROSS-REFERENCE TO RELATED APPLICATION

This application claims priority to Japanese Patent Application No. 2021-075148, filed on Apr. 27, 2021, the disclosure of which is hereby incorporated herein by reference in its entirety.

BACKGROUND

The present invention relates to a method for manufacturing a light emitting device, a bonding method, and a light emitting device.

Two members can be bonded together using a bonding material. Japanese Patent Publication No. 2011-204376 discloses that a transparent board and a wavelength conversion layer (corresponding to two members) are bonded via a transparent bonding layer (corresponding to a bonding material). It is also stated that when the members are to be bonded, the position of the transparent board can be controlled by adjusting the pressing force.

SUMMARY

In order to prevent product defects, it is important to bond the two members in a stable bonding state. In the case where there is a problem with the bonding state, this can lead to a defect in the device. In the case where the bonding state is poor, defects are likely to occur due to cumulative use over an extended period of time.

The embodiments include the aspects described below.

A light emitting device according to one embodiment of the present disclosure can be manufactured by a method for manufacturing a light emitting device including: disposing a light emitting element on a base member; providing a bonding agent to the base member or a lid member; and bonding the base member on which the light emitting element is disposed and the lid member with the bonding agent by sandwiching the bonding agent in a molten state between the base member and the lid member, and pressing the lid member against the base member, increasing a distance between the base member and the lid member in a state in which the lid member is pressed against the base member, while maintaining a state in which the bonding agent contacts the base member and the lid member, and solidifying the bonding agent in a state in which the distance between the base member and the lid member is increased to bond the base member and the lid member.

A light emitting device according to one embodiment of the present disclosure includes a base member, a light emitting element and a lid member and a bonding member. The base member includes a first upper surface and a second upper surface located above the first upper surface. The light emitting element is disposed on the first upper surface of the base member. The lid member is bonded to the second upper surface of the base member. The bonding member contacts the base member and the lid member and has a thickness of at least 15 μm and less than 40 μm between the base member and the lid member.

The present disclosure also discloses a bonding method using a bonding agent including: providing the bonding agent in a molten state to a bonding surface of a base member; sandwiching the bonding agent between the base member and a lid member and pressing the lid member against the base member; increasing a distance between the base member and the lid member in a state in which the lid member is pressed, while maintaining a state in which the bonding agent contacts the base member and the lid member; and solidifying the bonding agent in a state in which the distance between the members has been increased to bond the base member and the lid member.

One or more of the inventions disclosed by embodiments realizes a light emitting device having a stable bonding state.

DETAILED DESCRIPTION OF EMBODIMENTS

Figure 1:
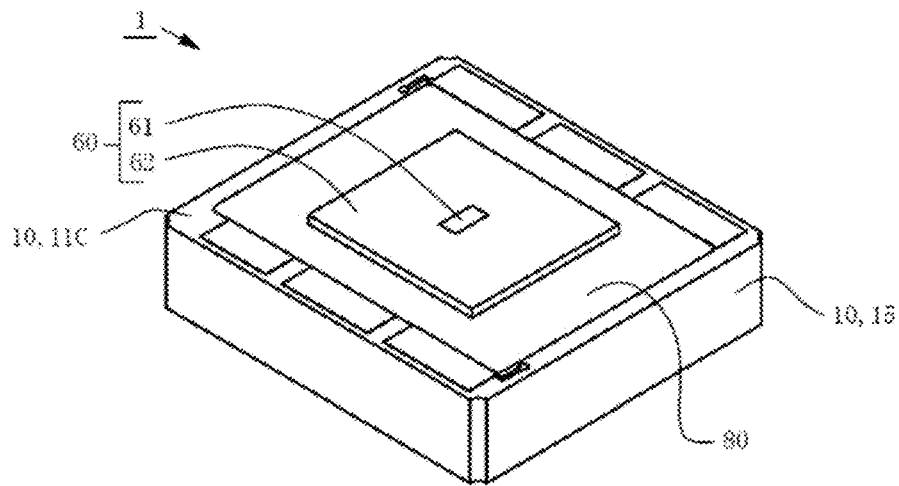
FIG. 1 is a perspective view of a light emitting device according to an embodiment.

In the description or the scope of claims herein, when describing a structure or shape as a polygonal shape, such as a triangle, quadrangle, or the like, any of those shapes subjected to processing such as cutting angles, chamfering, beveling, rounding, or the like will be included to that being referred to as a polygon. Similarly, a polygonal shape subjected to processing not only at a corner (one end of a side), but also in the intermediate portion of a side will also be referred to as a polygonal shape. In other words, any polygon-based shape subjected to processing is included in the interpretation of a "polygon" disclosed in the description and the scope of claims herein.

This applies to not only polygons, but also any word that describes a predetermined shape, such as a trapezoidal, circular, or recessed shape. This also applies when handling each side of a shape. In other words, even if a side is subjected to processing at a corner or in the intermediate portion, the interpretation of a "side" includes the processed portion. In the case of distinguishing a "polygon" or "side" that has been intentionally not processed from a processed shape, it will be expressed with the word, "exact," added thereto, for example, an "exact quadrangle."

In the description or the scope of claims herein, expressions such as upper/lower, right/left, front/rear, forward/rearward, foreground/background, and the like merely describe the relationships among the constituent elements, such as their relative positions, orientations, or directions of the constituent elements, and do not need to match the relationships of such in use.

In this specification, when a constituent element or the like is described, for example, it may call a "member" or a "portion." "Member" indicates an object that is physically treated as a single unit. Something that is physically treated as a single unit can also be an something that is treated as a single constituent element in the manufacturing process. On the other hand, "portion" refers to something that does not have to be physically treated as a single unit. For example, "portion" is used to refer to a part of a single member.

The above-mentioned distinction between "member" and "portion" does not indicate any intention to consciously limit the scope of rights in the interpretation of the doctrine of equivalents. That is, even if there is a constituent element called a "member" in the claims, this by itself does not mean that the applicant recognizes that physically treating this constituent element as a single unit is indispensable to the application of the present invention.

In this specification or claims, in the case where there are a plurality of a certain constituent element and a distinction is made in referring to them, the adjectives "first" and "second" may be added to the constituent elements to tell them apart. The things that are being distinguished between may differ between this specification and the claims. Therefore, even if a constituent element is described in the claims with the same adjective as in this specification, what is being specified by this constituent element may not be the same in this specification as in the claims.

For instance, there are constituent elements that differentiated by the addition of the adjectives "first," "second," and "third" in this specification, and in the case where constituent elements that were modified by "first" and "third" in this specification are mentioned in the claims, for the sake of simplicity those constituent elements may be differentiated by the addition of "first" and "second" in the claims from. In this case, those constituent elements modified by "first" and "second" in the claims indicate the constituent elements modified by "first" and "third" in this specification, respectively. The application of this rule is not limited to constituent elements and is reasonably and flexibly applied to other things as well.

Certain embodiments of the present disclosure will be explained below with reference to the drawings. The embodiments described below are provided to give shape to the technical ideas of the present invention and are not intended to limit the present invention. In the explanation below, the same designations and reference numerals denote the same or similar members, for which a redundant explanation will be omitted as appropriate. The sizes of and relative positions of the members shown in the drawings might be exaggerated for clarity of explanation.

Embodiment

Figure 2:
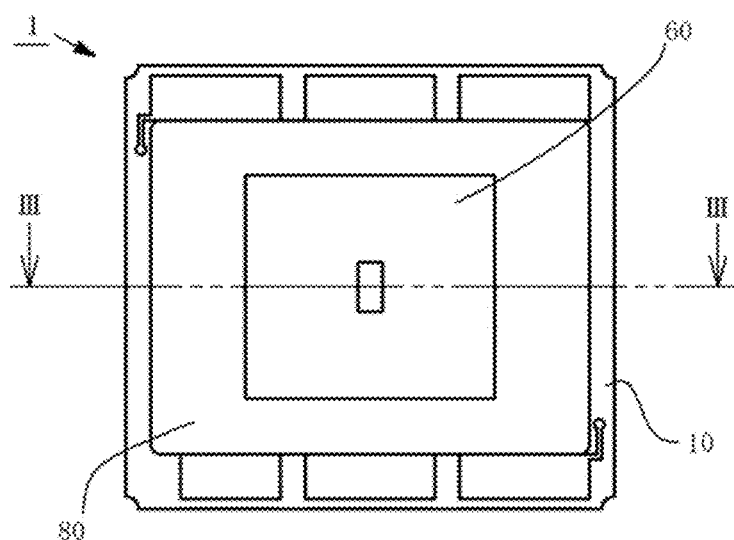
FIG. 2 is a top view of the light emitting device according to an embodiment.
Figure 3:
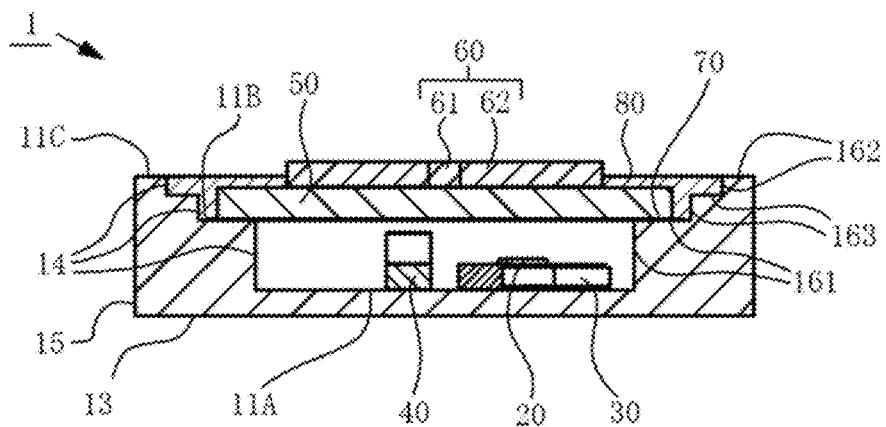
FIG. 3 is a cross-sectional view of the light emitting device according to an embodiment, along the III-III line in FIG. 2.
Figure 4:
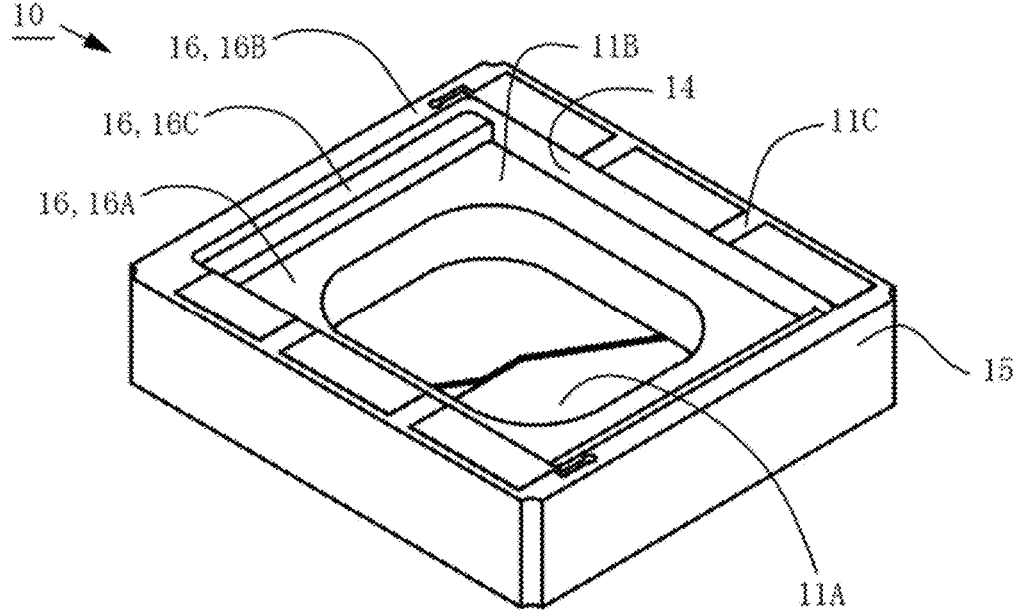
FIG. 4 is a perspective view of the base member according to an embodiment.
Figure 5:
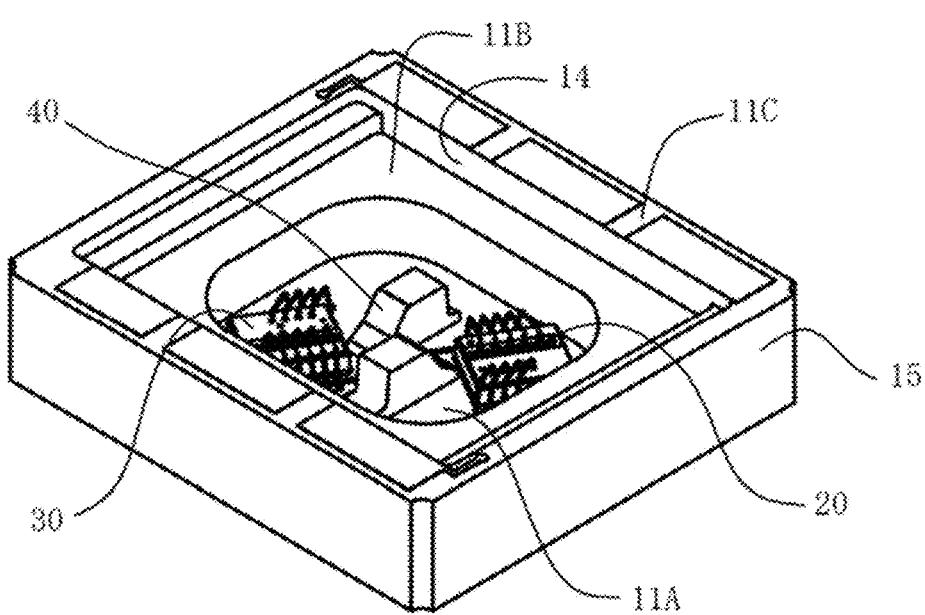
FIG. 5 is a perspective view of a state in which a light emitting element and other components have been disposed on a base member according to an embodiment.
Figure 6:
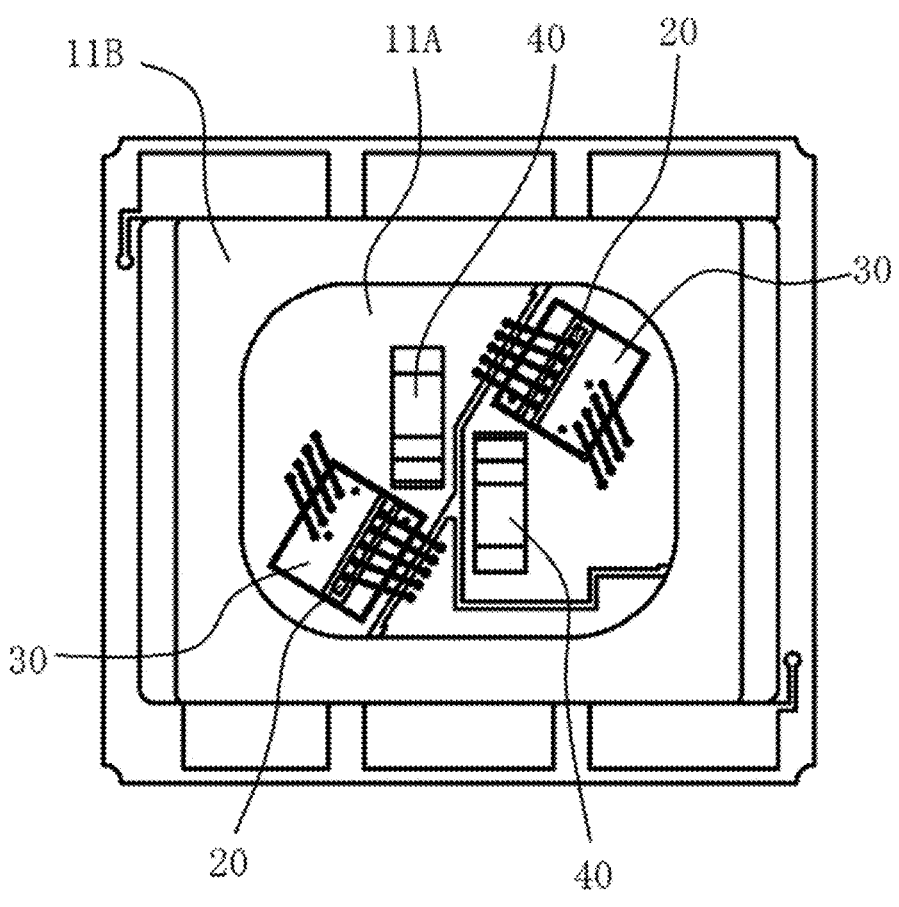
FIG. 6 is a top view of a state in which a light emitting element and the other components have been disposed on a base member according to an embodiment.
Figure 7:
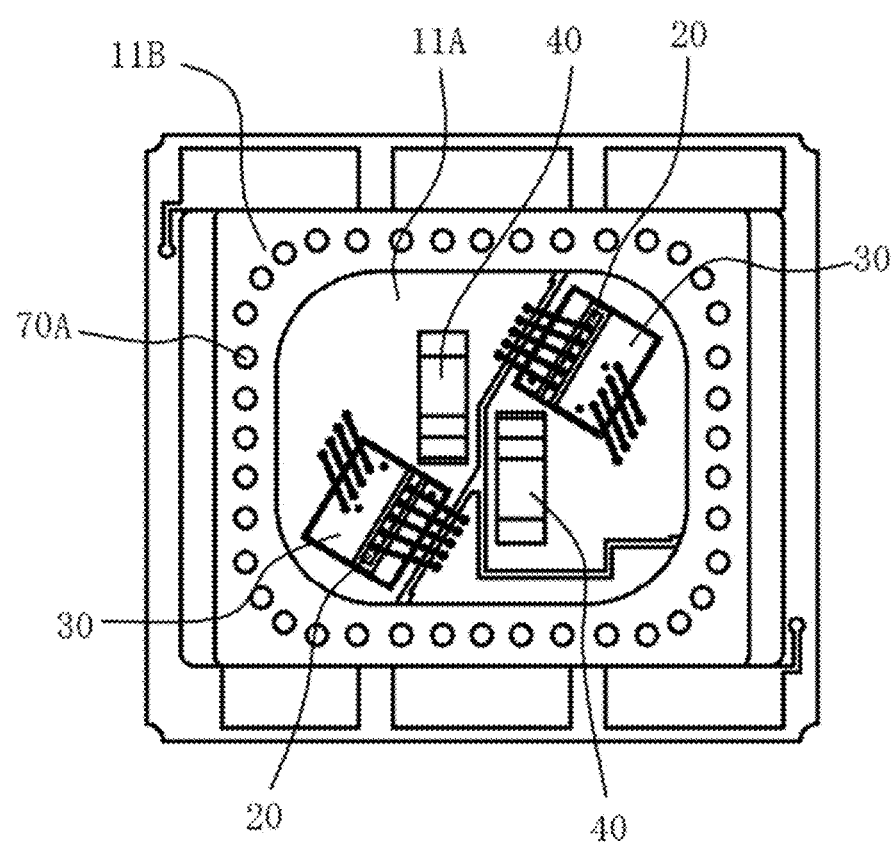
FIG. 7 is a top view of a state in which an bonding agent has been provided to a base member according to an embodiment.
Figure 8A:
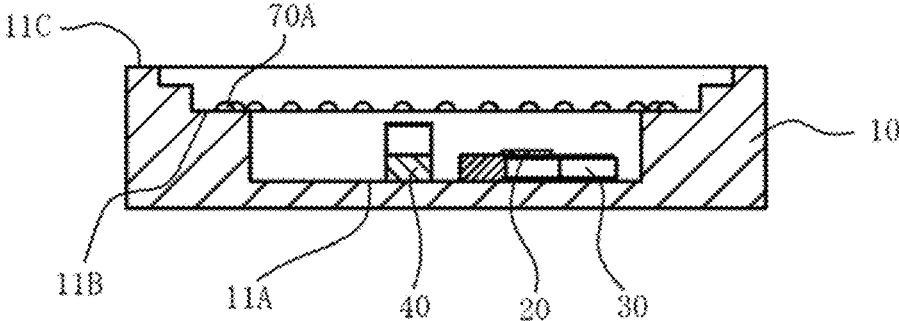
FIG. 8A is a cross-sectional view of a state in which a bonding agent has been provided to a base member according to an embodiment.
Figure 8B:
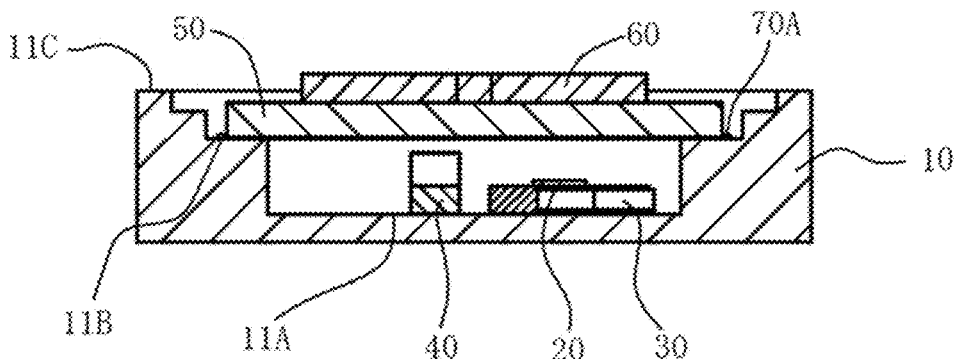
FIG. 8B is a cross-sectional view of a state in which a lid member is pressed against a base member according to an embodiment.
Figure 8C:
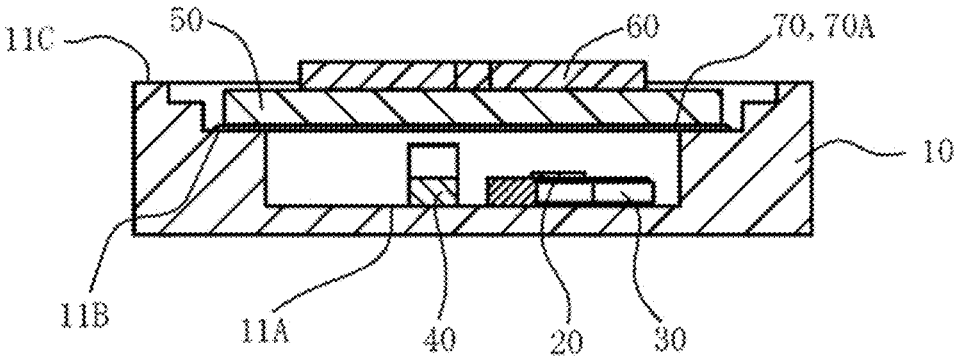
FIG. 8C is a cross-sectional view of a state in which the pressed lid member has been pulled up according to an embodiment.
Figure 9:
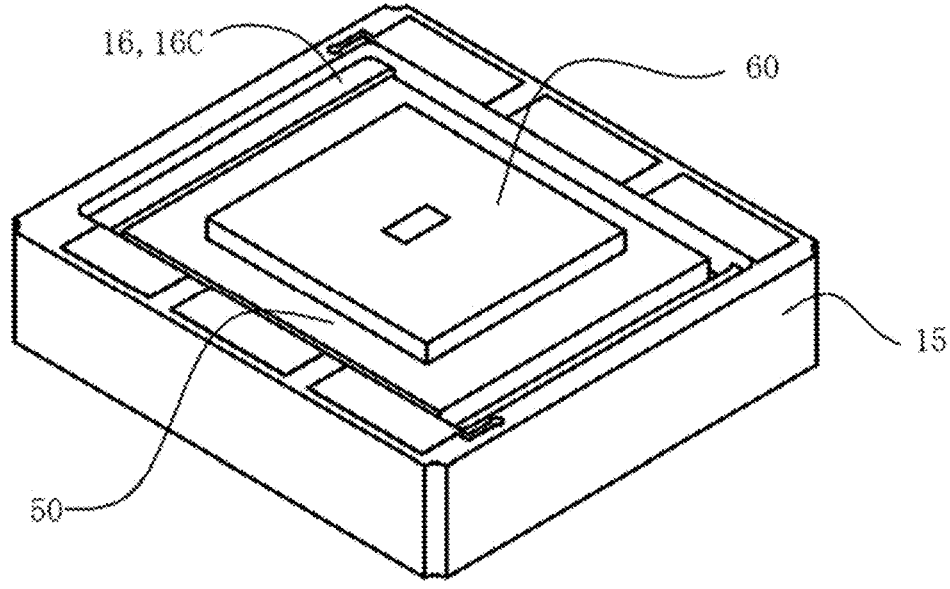
FIG. 9 is a perspective view of a state in which the lid member has been bonded to the base member according to an embodiment.
Figure 10:
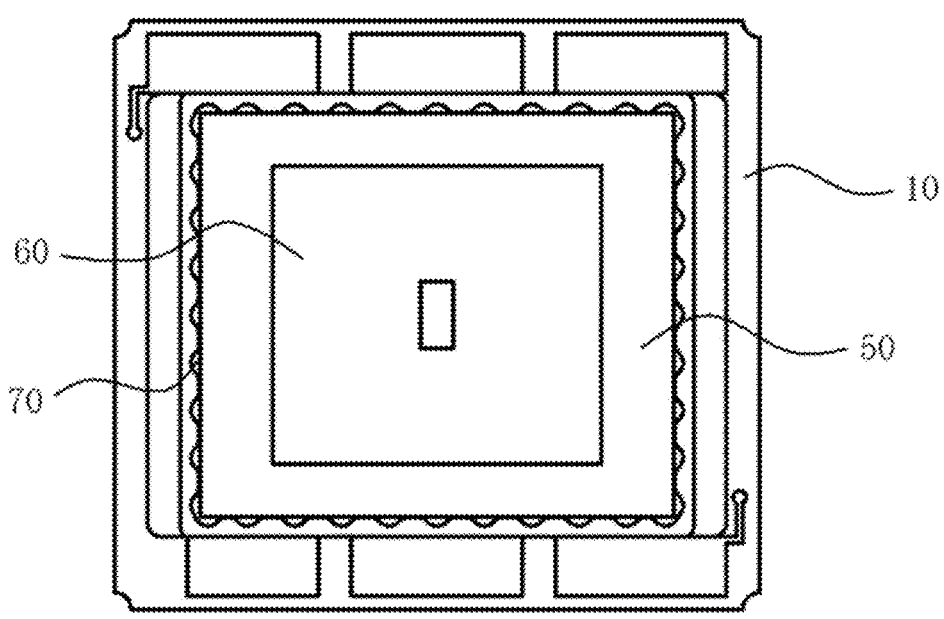
FIG. 10 is a top view of a state in which the lid member has been bonded to the base member according to an embodiment.
Figure 11A:
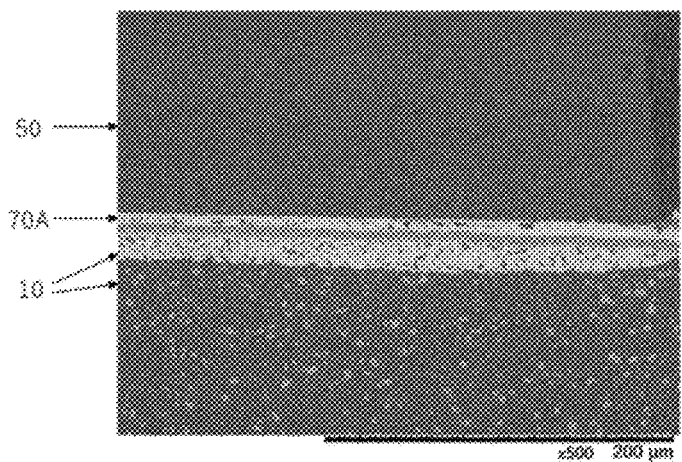
FIG. 11A is an image showing an example of a state in which the base member and the lid member have been bonded via a bonding agent according to an embodiment.
Figure 11B:
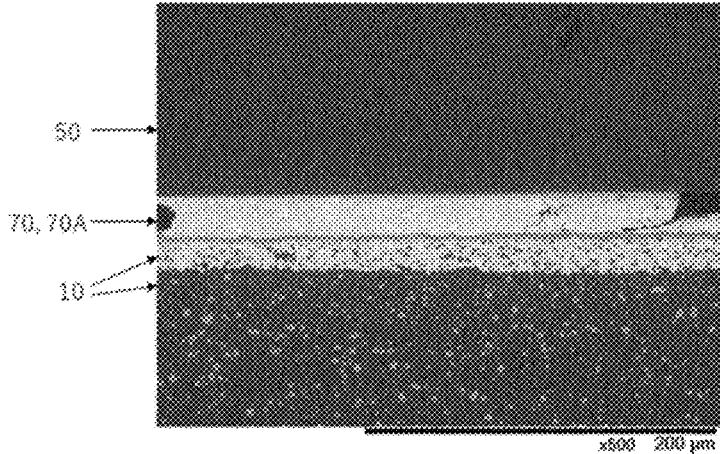
FIG. 11B is an image showing an example of a state in which the base member and the lid member have been bonded via a bonding agent according to an embodiment.
Figure 11C:
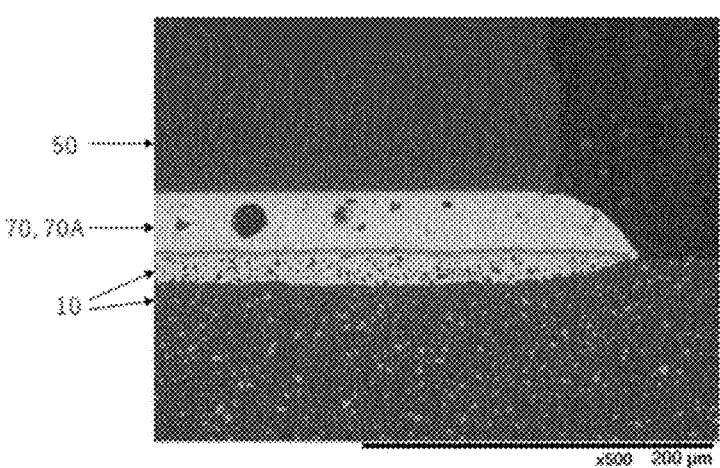
FIG. 11C is an image showing an example of a state in which the base member and the lid member have been bonded via a bonding agent according to an embodiment.

FIGS. 1 to 11c illustrate the light emitting device 1. FIG. 1 is a perspective view of the light emitting device 1. FIG. 2 is a top view of the light emitting device 1. FIG. 3 is a cross-sectional view of the light emitting device 1 along the III-III line in FIG. 2. FIG. 4 is a perspective view of the base member 10. FIG. 5 is a perspective view of the state in which the light emitting element 20 and other components are arranged on the base member 10. FIG. 6 is a top view of the state shown in FIG. 5. FIG. 7 is a top view of the state in which the bonding agent 70A has been provided on the base member 10. FIG. 8a is a cross-sectional view of the state of FIG. 7. FIG. 8B is a cross-sectional view of the state in which the lid member 50 is pressed against the base member 10. FIG. 8c is a cross-sectional view of the state in which the pressed lid member 50 has been pulled up. FIG. 9 is a perspective view of the state in which the lid member 50 has been bonded to the base member 10. FIG. 10 is a top view of the state of FIG. 9. FIG. 11A is an image showing an example of a state in which the base member and the lid member have been bonded via a bonding agent 70A. FIG. 11B is an image showing another example of a state in which the base member 10 and the lid member 50 have been bonded via a bonding agent 70A. FIG. 11C is an image showing another example of a state in which the base member 10 and the lid member 50 have been bonded via a bonding agent 70A.

In this specification, the various constituent elements of a light emitting device 1 will be described, after which a method for manufacturing the light emitting device 1 will be described. Also, in the description of this manufacturing method, the manufactured light emitting device 1 will also be described.

The light emitting device 1 has a plurality of constituent elements. The plurality of constituent elements includes a base member 10, one or more light emitting elements 20, one or more submounts 30, one or more reflective members 40, a lid member 50, a wavelength conversion member 60, a bonding member 70, and a light blocking (shielding) member 80.

The light emitting device 1 may include other components in addition to those mentioned above. For instance, the light emitting device 1 may include another light emitting element in addition to the light emitting element 20. The light emitting device 1 may not include some of the plurality of constituent elements mentioned here.

Base Member 10

The base member 10 has a lower surface 13, a first upper surface 11A, and a second upper surface 11B located above the first upper surface 11A. The base member 10 has a third upper surface 11C located above the second upper surface 11B. The base member 10 has one or more outer lateral surfaces 15 and one or more inner lateral surfaces 14.

The base member 10 has a concave portion that defines a recess. The recess is defined by the plurality of surfaces that constitute the concave portion. The plurality of surfaces that define the recess include the first upper surface 11A and the one or more inner lateral surfaces 14. The plurality of surfaces that define the recess include the second upper surface 11B. The third upper surface 11C surrounds the recess in top view. The one or more outer lateral surfaces 15 intersect the lower surface 13 and the third upper surface 11C.

In top view, the outer edge shape of the base member 10 is rectangular. In top view, the outer edge shape of the recess defined by the concave portion is rectangular. In top view, the second upper surface 11B is surrounded by the third upper surface 11C. In top view, the first upper surface 11A is surrounded by the second upper surface 11B.

The base member 10 has one or more stepped portions 16. The base member 10 may be configured to have a plurality of stepped portions 16 including a first stepped portion 16A and a second stepped portion 16B located above the first stepped portion 16A. The base member 10 may be configured to have a plurality of stepped portions 16 including a third stepped portion 16C that is located above the first stepped portion 16A and is located below the second stepped portion 16B.

One stepped portion 16 includes one upper surface and one or more lateral surfaces that intersect the upper surface and extend downward from the upper surface. Also, one stepped portion 16 does not include a lateral surface extending upward from the upper surface. The first stepped portion 16A has the second upper surface 11B. The second stepped portion 16B has the third upper surface 11C.

The base member 10 can be formed using a ceramic as the main material. For example, aluminum nitride, silicon nitride, aluminum oxide, or silicon carbide can be used as the ceramic. The main material of the base member 10 is not limited a ceramic, and the base member 10 can also be formed using some other material having insulating properties as the main material.

The "main material" here is the material whose mass or volume accounts for the largest proportion in the article to be formed. In the case where the article is formed from a single material, that material is the main material. That is, a given material being the main material includes a situation in which the proportion of that material is 100%.

Light Emitting Element 20

The light emitting element 20 has an upper surface, a lower surface, and one or more lateral surfaces. In the light emitting element 20, one or more of the upper surface, the lower surface, and the one or more lateral surfaces are light emission surfaces from which light is emitted.

The light emitting element 20 is, for example, a semiconductor laser element. The light emitting element 20 is not limited to being a semiconductor laser element, and may be, for example, a light emitting diode (LED) or an organic light emitting diode (OLED). In the example of the light emitting device 1 shown in the drawings, a semiconductor laser element is employed as the light emitting element 20.

The light emitting element 20 can be, for example, a light emitting element that emits blue light, a light emitting element that emits green light, or a light emitting element that emits red light. A light emitting element that emits light of some other color may also be used as the light emitting element 20.

Here, "blue light" refers to light whose emission peak wavelength falls within the range of 420 nm to 494 nm. "Green light" refers to light whose emission peak wavelength falls within the range of 495 nm to 570 nm. "Red light" refers to light whose emission peak wavelength falls within the range of 605 nm to 750 nm.

A semiconductor laser element, which is an example of the light emitting element 20, will be described. The semiconductor laser element has a rectangular shape in top view. The lateral surface intersecting one of the two short sides of the rectangle is the light emission surface of the semiconductor laser element. The upper and lower surfaces of the semiconductor laser device have a larger surface area than the light emission surface.

The light (laser light) emitted from the semiconductor laser element has a spread and forms an elliptical shape of far field pattern (hereinafter referred to as "FFP") in a plane parallel to the light emission surface. "FFP" refers to the shape and optical intensity distribution of emitted light at a position away from the light emission surface.

Here, light that passes through the center of the elliptical shape of the FFP, or in other words, light that has the peak intensity in the light intensity distribution of the FFP, is referred to as the light traveling along the optical axis, or as the light passing through the optical axis. In the light intensity distribution of an FFP, light having an intensity of at least $1/e^2$ with respect to the peak intensity value is called the main portion of light.

The shape of the FFP of the light emitted from the semiconductor laser element is an elliptical shape in which the stacking direction is longer than the direction perpendicular to the stacking direction in a plane parallel to the light emission end face. The stacking direction is the direction in which a plurality of semiconductor layers, including an active layer, are stacked in a semiconductor laser element. The direction perpendicular to the stacking direction can also be said to be the planar direction of the semiconductor layer. The major axis direction of the elliptical shape of the FFP can also be referred to as the fast axis direction of the semiconductor laser element, and the minor axis direction can be referred to as the slow axis direction of the semiconductor laser element.

The angle at which the light with a light intensity of $1/e^2$ of the peak light intensity spreads out, based on the light intensity distribution of the FFP, is defined as the light divergence angle of the semiconductor laser element. The light divergence angle can be found not only from a light intensity of $1/e^2$ of the peak light intensity, but also from a light intensity that is one-half the peak light intensity, for example. In the description of this specification, when we refer simply to the "light divergence angle," we mean the light divergence angle at a light intensity of $1/e^2$ of the peak light intensity. The divergence angle in the fast axis direction can be said to be greater than the divergence angle in the slow axis direction.

Examples of a semiconductor laser element that emits blue light or a semiconductor laser element that emits green light include a semiconductor laser element containing a nitride semiconductor. The nitride semiconductor can be, for example, GaN, InGaN, or AlGaN. Examples of a semiconductor laser element that emits red light include those containing InAlGaP-based, GaInP-based, GaAs-based, and AlGaAs-based semiconductors.

Submount 30

The submount 30 is configured in a rectangular cuboid shape, and has a lower surface, an upper surface, and lateral surfaces. The submount 30 has the smallest width in the up and down direction. The shape is not limited to being cuboid. The submount 30 is formed using, for example, silicon nitride, aluminum nitride, or silicon carbide, but other materials may also be used. A metal film is provided on the upper surface of the submount 30.

Reflective Member 40

The reflective member 40 has a light reflecting surface that reflects light. The light reflecting surface is inclined with respect to a lower surface of the reflective member 40. That is, the light reflecting surface is neither vertical nor parallel in terms of its layout relationship when viewed from the lower surface. A straight line connecting the lower end and the upper end of the light reflecting surface is inclined with respect to the lower surface of the reflecting member 40. The angle of the light reflecting surface with respect to the lower surface, or the angle of a straight line connecting the lower end and the upper end of the light reflecting surface with respect to the lower surface, shall be referred to as the inclination angle of the light reflecting surface.

In the reflecting member 40 shown in the drawings, the light reflecting surface is a flat surface and forms an inclination angle of 45 degrees with respect to the lower surface of the reflecting member 40. The light reflecting surface does not have to be a flat surface, and may instead be a curved surface, for example. The angle of inclination of the light reflecting surface does not have to be 45 degrees.

The main material of the reflective member 40 can be glass, metal, or the like. The main material is preferably a material that is resistant to heat, and quartz, BK7 (borosilicate glass) or other such glass, or a metal such as aluminum can be used, for example. The reflective member 40 can also be formed by using silicon as the main material. In the case where the main material is a reflective material, the light reflecting surface can be formed from the main material. In the case where the light reflecting surface is formed from something other than the main material, the light reflecting surface can be formed by using a metal such as silver or aluminum, or a dielectric multilayer film such as $Ta_2O/SiO_2$, $TIO_2/SiO_2$, or $Nb_2O_5/SiO_2$, for example.

In the light reflecting surface, the reflectance with respect to the peak wavelength of the light with which the light reflecting surface is irradiated is 90% or more. The reflectance may be 95% or more, or 99% or more. The light reflectance is 100% or less or is less than 100%.

Lid Member 50

The lid member 50 is configured in a cuboid flat-plate shape, and has a lower surface, an upper surface, and one or more lateral surfaces. The lid member is light transmissive enough to allow light to pass through. The term "light transmissive" means that the transmittance to light is at least 80%. The lid member does not have to have a transmittance of at least 80% for light of all wavelengths. The shape of the lid member 50 is not limited to a cuboid shape.

The lid member 50 can be formed using sapphire as the main material. Sapphire is a material with a relatively high refractive index and relatively high strength. In addition to sapphire, the main material can be, for example, quartz, silicon carbide, glass, or the like.

Wavelength Conversion Member 60

The wavelength conversion member 60 is configured in a cuboid flat-plate shape, and has a lower surface, an upper surface, and lateral surfaces. The wavelength conversion member 60 has a light-transmissive wavelength conversion portion 61 and a surrounding portion 62. The wavelength conversion portion 61 and the surrounding portion 62 are formed integrally. The inner lateral surfaces of the surrounding portion 62 are in contact with the lateral surfaces of the wavelength conversion portion 61, and the outer lateral surfaces of the surrounding portion 62 correspond to the lateral surfaces of the wavelength conversion member 60.

The wavelength conversion portion 61 has a cuboid shape. The wavelength conversion portion 61 converts the light incident on the wavelength conversion portion 61 into light of a different wavelength. The wavelength conversion member 60 can be formed using an inorganic material that is not easily decomposed by optical irradiation as the main material, but this does not have to be an inorganic material.

The wavelength conversion portion 61 can be formed using ceramic as the main material and may contain a phosphor. This is not the only option, and glass may be used as the main material, or this unit may be formed of a single crystal of a fluorescent substance.

Phosphors include cerium-activated yttrium aluminium garnet (YAG), cerium-activated lutetium aluminium garnet (LAG), nitrogen-containing calcium aluminosilicate ($CaO$—$Al_2O_3$—$SiO_2$) activated with europium and/or chromium, silicate (($Sr$, $Ba)_2SiO_4$) activated with europium, alpha sialon phosphor, beta sialon phosphor, etc. Among these, it is preferable to use YAG phosphors, which have good heat resistance.

The surrounding portion 62 has a shape with a through-hole in the central portion of a cuboid flat plate. The wavelength conversion portion 61 is provided in the region of the through-hole. Also, the shape of the through-hole corresponds to the shape of the wavelength conversion portion 61, and the surrounding portion 62 surrounds the lateral surfaces of the wavelength conversion portion 61.

The surrounding portion 62 can be formed using a ceramic as the main material. This is not the only option, and a metal or a composite of a ceramic and a metal may be used. It is preferable to use a material whose thermal conductivity is high enough to dissipate the heat produced by the wavelength conversion portion 61 for the surrounding portion 62. In the case where a material having high thermal conductivity is used as the main material of the surrounding portion 62, this surrounding portion will have a heat radiating function for dissipating heat in the wavelength conversion portion 61, and in this regard the surrounding portion can be viewed as a heat radiating member instead of the surrounding portion 62.

Light Blocking Member 80

The light blocking member 80 is formed from a resin having a light blocking property. The term "light blocking property" refers to a property of not transmitting light, and in addition to the property of blocking light, this "light blocking property" may be realized by utilizing a property of absorbing light, a property of reflecting light, or the like. This member can be formed by adding a filler such as a light diffusing material and/or a light absorbing material to a resin.

Examples of the resin that forms the light blocking member 80 include epoxy resin, silicone resin, acrylate resin, urethane resin, phenol resin, BT resin, and the like. Examples of light absorbing fillers include dark-colored pigments such as carbon black.

Method for Manufacturing Light Emitting Device 1

The method for manufacturing the light emitting device 1 may include a step of disposing the reflecting member 40 on the base member 10. In this step, one or more reflective members 40 are disposed on the first upper surface 11A of the base member 10. In the manufacture of the light emitting device 1 shown in the drawings, two reflecting members 40 are disposed so as to be in point symmetry in top view.

The method for manufacturing the light emitting device 1 may include a step of disposing the submount 30 on the base member 10. In this step, one or more submounts 30 are disposed on the first upper surface 11A of the base member 10. In the manufacture of the light emitting device 1 shown in the drawings, two submounts 30 are disposed so as to be in point symmetry in top view. The point of symmetry is in the same positions as the point of symmetry of the two reflective members 40.

The method for manufacturing the light emitting device 1 includes a step of disposing the light emitting element 20 on the base member 10. In this step, one or more light emitting elements 20 are disposed on the first upper surface 11A of the base member 10. The one or more light emitting elements 20 are disposed on the submount 30 disposed on the base member 10. The one or more light emitting elements 20 are disposed on the base member 10 via the submount 30. In the manufacture of the light emitting device 1 shown in the drawings, two light emitting elements 20, which are each a semiconductor laser element, are disposed so as to be in point symmetry in top view. The point of symmetry is in the same positions as the point of symmetry of the two reflective members 40.

The method for manufacturing the light emitting device 1 includes a step of providing a bonding agent 70A on the base member 10. In this step, the bonding agent 70A is provided in a predetermined region in order to bond the base member 10 and the lid member 50. The bonding agent 70A is provided on the second upper surface 11B of the base member 10.

The base member 10 has an annular region in which the bonding agent 70A is provided. As used herein, the term "annular" is not limited to a circular ring shape, but rather refers to a closed-loop shape. The second upper surface 11B has this annular region. The bonding agent 70A is disposed along and within this annular region. The bonding agent 70A is disposed at a plurality of locations at predetermined intervals. The bonding agent may also be provided in a shape that is connected in an annular shape without any gaps. However, spotting the bonding agent 70A at a plurality of locations with spaces in between can reduce the amount in which the bonding agent 70A is used.

As an example, the distance between adjacent spots of bonding agent 70A is at least 100 μm and no more than 300 μm. In the case where adjacent spots of bonding agent 70A are spaced too far apart, the adjacent spots of bonding agent 70A may not be bonded together in the bonding step, and the members may be bonded in a state in which the spots of bonding agent 70A are not connected together. In the case where the spots of bonding agent 70A should be connected in an annular shape after the bonding step, it will be necessary to adjust the distance between the spots of bonding agent 70A and the quantity of each spot of bonding agent 70A. For example, in the case where the space surrounded by the base member 10 and the lid member 50 by bonding to be sealed, it is preferable for the spots of bonding agent 70A to be connected in an annular shape after the bonding step.

In the annular region, each spot of bonding agent 70A is provided in a ball shape. The total number of spots of bonding agent 70A disposed in the annular region is 10 or more. The term "ball shape" is not limited to the exact ball shape. For instance, the shapes shown in FIGS. 7 and 8A are also included in "ball shape."

Solder can be used for the bonding agent 70A. Although solder made of AuSn can be used as the bonding agent 70A, AuSn is not the only option, and a solder made of SnPb can also be used. Instead of a solder, the bonding agent 70A can be a brazing material made of silver, copper, or the like. The bonding agent 70A can also be one made from a paste material containing gold. In the light emitting device 1 shown in the drawings, for example, AuSn solder is used.

The method for manufacturing the light emitting device 1 includes a step of bonding the base member 10 and the lid member 50 with the bonding agent 70A. With the light emitting device 1 shown in the drawings, the space in which the light emitting element 20 is disposed is sealed by this step. Therefore, the step of bonding the base member 10 and the lid member 50 can also be a step of sealing the space in which the light emitting element 20 is disposed.

With the light emitting device 1 shown in the drawings, the base member 10 and the lid member 50 are bonded under a predetermined atmosphere. Consequently, the space in which the light emitting element 20 is disposed is hermetically sealed in the predetermined atmosphere. This adjusts the environment in which the light emitting element 20 operates. Since AuSn solder has a relatively low melting point, it is a bonding agent that is easy to use when the bonding step is performed in a state in which the light emitting element 20 is disposed.

The bonding agent 70A provided on the base member 10 is sandwiched between the base member 10 and the lid member 50. The bonding agent 70A provided on the base member 10 adheres to the lid member 50 so as to be sandwiched between the base member 10 and the lid member 50. The bonding agent 70A may be adhered to the lid member 50 first, and the bonding agent 70A provided on the lid member 50 then adhered to the base member 10. The bonding agent 70A is solidified after being adhered to the base member 10 and the lid member 50, thereby bonding the base member 10 and the lid member 50.

This bonding process includes a step of pressing the lid member 50 against the base member 10, a step of pulling up the lid member 50 after the pressing, and a step of solidifying the bonding agent 70A after the pulling up.

In the step of pressing the lid member 50 against the base member 10, the lid member 50 is lowered from above the base member 10 resting on a table, and the lid member 50 is pressed until a predetermined load is applied to the base member 10. Instead of fixing the base member 10 and moving the lid member 50 to press the lid member 50 against the base member 10, the lid member 50 may be fixed and the base member 10 moved to press the lid member 50 against the base member 10.

When the lid member 50 is pressed against the base member 10, the bonding agent 70A provided on the base member 10 is in a molten state. The molten bonding agent 70A is sandwiched between the base member 10 and the lid member 50, and the lid member 50 is pressed against the base member 10. Consequently, the bonding agent 70A provided on the base member 10 is squashed. The squashing of the bonding agent 70A connects the adjacent spots of bonding agent 70A, forming the bonding agent 70A in an annular shape.

The step of pressing the lid member 50 against the base member 10 can also be said to be a step of connecting the spots of bonding agent 70A provided at a plurality of locations to form the bonding agent 70A in an annular shape. This step allows the spots of bonding agent 70A disposed at a plurality of places at a predetermined spacing to be connected. Forming the bonding agent 70A into an annular shape allows the space in which the light emitting element 20 is disposed to be sealed when the base member 10 and the lid member 50 are bonded. When sealing is not necessary, the adjacent spots of bonding agent 70A do not necessarily have to be connected but solidifying the bonding agent 70A in a connected shape is preferable in terms of stabilizing the bonded state.

As an example, the predetermined load applied to the base member 10 is at least 0.8 N and no more than 100 N. The load at 0.8 N or more allows the bonding agent 70A to be appropriately squashed, and the load at 100 N or less reduces the load exerted on the base member 10 and the lid member 50. Although it depends on the material of the base member 10 and the lid member 50, if an excessive load is exerted, it may cause product defects such as breakage or distortion.

In the step of pulling up the lid member 50, the lid member 50 is pulled up from the state in which the lid member 50 is pressed against the base member 10, while maintaining the state in which the bonding agent 70A is adhered to the lid member 50 and the base member 10. Consequently, the distance between the base member 10 and the lid member 50 is wider than in the state in which the lid member 50 is pressed against the base member 10. The step of pulling up the lid member 50 can also be said to be a step of increasing the distance between the base member 10 and the lid member 50 over that when the lid member 50 is pressed against the base member 10.

Using as a reference the position of the lid member 50 in a state in which a predetermined load is exerted on the base member 10, the lid member 50 is pulled up from this position to a predetermined height. A state in which a predetermined load is exerted on the base member 10 could also be said to be a state in which the lid member 50 is pressed against the base member 10. The annular bonding agent 70A is interposed between the base member 10 and the lid member 50 and fills in the space between the bonding surface of the base member 10 and the bonding surface of the lid member 50. In the light emitting device 1 shown in the drawings, the bonding surface of the base member 10 is the second upper surface 11B, and the bonding surface of the lid member 50 is the lower surface of the lid member 50.

The step of pulling up the lid member 50 also maintains a state in which the bonding agent 70A contacts the base member 10 and the lid member 50. While this state is maintained, the lid member 50 pressed against the base member 10 is pulled up. Consequently, the distance between the base member 10 and the lid member 50 can be increased while maintaining the state in which the bonding agent 70A is contacts the base member 10 and the lid member 50. Increasing the thickness of the bonding agent 70A sandwiched between the base member 10 and the lid member 50 allows the base member 10 and the lid member 50 to be bonded in a stable state.

In the step of solidifying the bonding agent 70A, the bonding agent 70A is solidified in a state in which the distance between the base member 10 and the lid member 50 has been widened by the step of pulling up the lid member 50. Consequently, the thickness of the bonding agent 70A between the base member 10 and the lid member 50 is adjusted, and the base member 10 and the lid member 50 are bonded to each other. In the light emitting device 1, the bonding agent 70A that has been solidified in a state of bonding the base member 10 and the lid member 50 is sometimes called a bonding member 70.

The step of bonding the base member 10 and the lid member 50 by means of the bonding agent 70A preferably bonds the base member 10 and the lid member 50 such that the thickness of the bonding agent 70A sandwiched between the base member 10 and the lid member 50 is at least 15 μm and less than 40 μm. In other word, the thickness of the bonding agent 70A sandwiched between the base member 10 and the lid member 50 after completion of the bonding of the base member 10 and the lid member 50 is preferably at least 15 μm and less than 40 μm. This affords more stable bonding of the base member 10 and the lid member 50. The thickness of the bonding agent 70A sandwiched between the base member 10 and the lid member 50 is also the distance between the bonding surface of the base member 10 and the bonding surface of the lid member 50.

FIGS. 11A to 11C are images for illustrating the change in the bonding state due to whether or not there is a step of pulling up the lid member 50, and the difference in the thickness of the bonding agent 70A. FIG. 11A is an image of when the bonding agent 70A was solidified without performing a step of pulling up the lid member 50. The thickness of the bonding agent 70A at this point was 6 μm. FIG. 11B is an image of when the bonding agent 70A was solidified after the thickness of the bonding agent 70A was adjusted to 20 μm by the step of pulling up the lid member 50. FIG. 11C is an image of when the bonding agent 70A was solidified after the thickness of the bonding agent 70A was adjusted to 30 μm by the step of pulling up the lid member 50.

In the image of FIG. 11A, it can be seen that fine cracks have occurred over a wide range of the bonding surface. When fine cracks occur in this manner, the temperature environment changes due to the use of the light emitting device, and the cracks themselves become larger, merge together, etc., due to the difference in the coefficients of linear expansion between the base member 10 and the lid member 50. As a result, poor bonding with the bonding agent 70A may occur.

In the image of FIG. 11B, it can be seen that cracks have not occurred over a wide range of the bonding surface. Although cracks occur at the end of the bonding agent 70A, cracks generated at the end have little effect, and the bonding state is more stable than in the case of FIG. 11A.

In the image of FIG. 11C, no cracks occur over a wide range of the bonding surface, and in fact no cracks to speak of are observed. It can be said that the bonding state is more stable than in the case of FIG. 11B.

Table 1 shows the relation between the thickness of the bonding agent 70A and the bonding state. The bonding state is based on the structure of the light emitting device 1 shown in the drawings, and the bonding state of several light emitting devices 1 each having a different thickness of the bonding agent 70A was checked. A "poor" is used to indicate that the bonding state was unstable, an "excellent" to indicate that the bonding state was stable, and an "average" to indicate that there was a large amount of variance between samples with a stable bonding state and samples with an unstable bonding state. The bonding state in FIG. 11A is "poor", and the bonding state in FIGS. 11B and 11C is "excellent".

TABLE 1

| | Thickness of bonding agent (μm) | | | | | |
| --- | --- | --- | --- | --- | --- | --- |
| | 4 to 6 | 6 to 9 | 9 to 12 | 18 to 21 | 30 to 33 | 40 or more |
| Bonding state | Poor | Poor | Average | Excellent | Excellent | Average |

In the results shown in Table 1, the reason that the bonding state was "average" when the thickness of the bonding agent 70A was 40 μm or more is that the distance between the base member 10 and the lid member 50 was large, and the state in which the bonding agent 70A contacted the base member 10 and the lid member 50 was no longer maintained. That is, if the distance is increased far beyond 40 μm, the base member 10 and the lid member 50 cannot even be bonded, and the bonding state becomes "poor".

Based on the results in Table 1, it can be said that the bonding state of the base member 10 and the lid member 50 is stable when the thickness of the bonding agent 70A is at least 15 µm and less than 40 µm. Also, the thickness of the bonding agent 70A is preferably in the range of at least 15 µm to no more than 35 µm. Also, it is more preferable for the thickness of the bonding agent 70A to be in the range of at least 18 µm and no more than 33 µm.

On the other hand, in the step of pressing the lid member 50 against the base member 10, the thickness of the bonding agent 70A sandwiched between the base member 10 and the lid member 50 is preferably 10 µm or less. Applying a load causes the bonding agent 70A to lengthen and widen, and the bonding surface area at the bonding surface can be increased. Contact with the bonding agent 70A over a wider range stabilizes the bonding state.

With the base member 10 and the lid member 50 bonded together, the bonding member 70 of the light emitting device 1 is provided so as to contact the base member 10 and the lid member 50 and has a thickness of at least 15 µm and less than 40 µm between the base member 10 and the lid member 50.

In the method for manufacturing the light emitting device 1, the wavelength conversion member 60 may be bonded to the lid member 50 before the lid member 50 is bonded to the base member 10. That is, the lid member 50 with the attached wavelength conversion member 60 may be bonded to the base member 10.

The method for manufacturing the light emitting device 1 may include a step of bonding the wavelength conversion member 60 to the lid member 50. The wavelength conversion member 60 is bonded to the lid member 50 by bonding the lid member 50 to the surrounding portion 62, and. The lid member 50 and the wavelength conversion portion 61 need not be bonded. The lid member 50 and the wavelength conversion portion 61 may be bonded.

The light emitted from one or more light emitting elements 20, reflected by the light reflecting surface of the reflecting member 40, and transmitted through the lid member 50 is incident on the wavelength conversion portion 61 of the wavelength conversion member 60. Some or all of the light incident on the wavelength conversion portion 61 is converted into light of a different wavelength by the wavelength conversion portion 61. The laser light and the wavelength-converted light are emitted from the upper surface of the wavelength conversion portion 61 to the outside of the light emitting device 1. The upper surface of the wavelength conversion portion 61 could be called the light extraction surface of the light emitting device 1.

The method for manufacturing the light emitting device 1 may include a step of providing a light blocking member 80. The light blocking member 80 is formed on the inside of the third upper surface 11C of the base member 10. The light blocking member 80 is formed so as to fill in the gap between the base member 10 and the wavelength conversion member 60. The light blocking member 80 can be formed by pouring in a resin and curing it with heat. The light blocking member 80 is provided below the third upper surface 11C and below the upper surface of the wavelength conversion member 60. The resin does not enter the space where light emitting element 20 is disposed.

Since the light emitting device 1 has the light blocking member 80, the light emitted from the light emitting element 20 is less likely to leak out from a place other than the wavelength conversion portion 61 (light extraction surface).

The present invention having the technical features disclosed in this specification is not limited to the structure described in the embodiments of the specification. For example, the present invention can be applied even in the case where there are constituent elements not disclosed in an embodiment, and a partial difference from the disclosed structure does not constitute a basis for the present invention not to be applicable.

That is, it is shown that the present invention can be applied even though it is not essential for all the constituent elements disclosed in embodiments to be provided. For example, in the case where some of the constituent elements of the light emitting device disclosed by an embodiment were not described in the claims, those constituent elements are not limited to what was disclosed in the embodiment, and in recognition of the design latitude with a person skilled in the art, such as substitutions, omissions, changes in shape, changes in material, etc., it is claimed that the invention described in the claims is applicable.

The light emitting devices described in the embodiment can be used for light sources such as automotive headlights, lighting, projectors, head mounted displays, other display backlights, etc.

What is claimed is:

1. A method for manufacturing a light emitting device comprising:
   disposing a light emitting element on a base member;
   providing a bonding agent to the base member or a lid member; and
   bonding the base member on which the light emitting element is disposed and the lid member with the bonding agent by
      sandwiching the bonding agent in a molten state between the base member and the lid member, and pressing the lid member against the base member,
      increasing a distance between the base member and the lid member in a state in which the lid member is pressed against the base member, while maintaining a state in which the bonding agent contacts the base member and the lid member, and
      solidifying the bonding agent in a state in which the distance between the base member and the lid member is increased to bond the base member and the lid member, wherein
   the increasing of the distance between the base member and the lid member includes pulling up the lid member from a position of the lid member in a state in which a predetermined load is exerted on the base member to a position at a predetermined height to increase the distance between the base member and the lid member.

2. The method for manufacturing a light emitting device according to claim 1, wherein
   in the pressing of the lid member against the base member, the lid member is pressed against the base member such that a thickness of the bonding agent sandwiched between the base member and the lid member is 10 µm or less.

3. The method of manufacturing a light emitting device according to claim 1, wherein
   a thickness of the bonding agent sandwiched between the base member and the lid member after completion of the bonding of the base member and the lid member is at least 15 µm and less than 40 µm.

4. The method of manufacturing a light emitting device according to claim 1, wherein
   a space in which the light emitting element is disposed is sealed by the bonding of the base member and the lid member.

5. The method of manufacturing a light emitting device according to claim 1, wherein
   the providing of the bonding agent includes using an AuSn solder as the bonding agent.

6. The method of manufacturing a light emitting device according to claim 1, wherein the bonding of the base member and the lid member with the bonding agent is performed under a predetermined atmosphere to hermetically sealed a space in which the light emitting element is disposed.

7. The method of manufacturing a light emitting device according to claim 1, wherein the base member is formed using a ceramic as a main material, and the lid member is formed using sapphire as a main material.

8. The method of manufacturing a light emitting device according to claim 1, wherein the providing the bonding agent to the base member or the lid member includes providing a plurality of spots of the bonding agent on an annular region of a bonding surface of the base member or the lid member, along the annular region at a plurality of locations at predetermined intervals, and adjacent ones of the spots of bonding agent are connected by the pressing of the lid member against the base member.

9. The method of manufacturing a light emitting device according to claim 1, wherein the providing the bonding agent to the base member or the lid member includes providing 10 or more spots of the bonding agent at predetermined intervals with each of the spots of the bonding agent having a ball shape.

10. The method of manufacturing a light emitting device according to claim 1, wherein the light emitting element is a semiconductor laser element.

11. A bonding method using a bonding agent comprising:

providing the bonding agent in a molten state to a bonding surface of a base member;

sandwiching the bonding agent between the base member and a lid member and pressing the lid member against the base member;

increasing a distance between the base member and the lid member in a state in which the lid member is pressed, while maintaining a state in which the bonding agent contacts the base member and the lid member;

solidifying the bonding agent in a state in which the distance between the members has been increased to bond the base member and the lid member, wherein the increasing of the distance between the base member and the lid member includes pulling up the lid member from a position of the lid member in a state in which a predetermined load is exerted on the base member to a position at a predetermined height to increase the distance between the base member and the lid member.

* * * * *